(12) United States Patent
Wyss et al.

(10) Patent No.: US 12,117,511 B2
(45) Date of Patent: Oct. 15, 2024

(54) AUTOMATED ADJUSTMENT OF THE UNDERSAMPLING FACTOR

(71) Applicant: KONINKLIJKE PHILIPS N.V., Eindhoven (NL)

(72) Inventors: Michael Wyss, Ruschlikon (CH); Andreas Hock, Ruschlikon (CH); Kilian Weiss, Cologne (DE)

(73) Assignee: Koninklijke Philips N.V., Eindhoven (NL)

( * ) Notice: Subject to any disclaimer, the term of this patent is extended or adjusted under 35 U.S.C. 154(b) by 66 days.

(21) Appl. No.: 17/923,922

(22) PCT Filed: May 14, 2021

(86) PCT No.: PCT/EP2021/062831
§ 371 (c)(1),
(2) Date: Nov. 8, 2022

(87) PCT Pub. No.: WO2021/229055
PCT Pub. Date: Nov. 18, 2021

(65) Prior Publication Data
US 2023/0168327 A1 Jun. 1, 2023

(30) Foreign Application Priority Data
May 15, 2020 (EP) .................... 20174864

(51) Int. Cl.
*G01V 3/00* (2006.01)
*G01R 33/48* (2006.01)
(Continued)

(52) U.S. Cl.
CPC ..... *G01R 33/5608* (2013.01); *G01R 33/4818* (2013.01); *G01R 33/543* (2013.01);
(Continued)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 10,140,421 B1 * 11/2018 Bernard .................... G06T 7/11
2003/0216635 A1 * 11/2003 Cohen ................ G01R 33/5601
600/410
(Continued)

FOREIGN PATENT DOCUMENTS

EP 3333585 A2 6/2018

OTHER PUBLICATIONS

Yann Lucun et al "Deep Learning" Nature, vol. 521, No. 7553, p. 436-444 May 1, 2015.
(Continued)

*Primary Examiner* — Walter L Lindsay, Jr.
*Assistant Examiner* — Frederick Wenderoth

(57) ABSTRACT

Disclosed herein is a method of operating a medical system (100, 300). The method comprises receiving (200) pulse sequence commands (124) configured to control a magnetic resonance imaging system (302) to acquire k-space data (330) according to a Compressed Sensing magnetic resonance imaging protocol. The method further comprises receiving (202) magnetic resonance scan parameters that are descriptive of a configuration of the pulse sequence commands and a configuration of the magnetic resonance imaging system. The method further comprises receiving (204) an predicted undersampling factor (128) in response to inputting the magnetic resonance scan parameters into a neural network, wherein the neural network is configured to output the predicted undersampling factor in response to receiving magnetic resonance scan parameters. The method further comprises adjusting (206) the pulse sequence com-
(Continued)

mands (130) to select or modify sampling of the k-space data based on the predicted undersampling factor.

20 Claims, 8 Drawing Sheets

(51) Int. Cl.
- *G01R 33/54* (2006.01)
- *G01R 33/56* (2006.01)
- *G01R 33/561* (2006.01)
- *G06T 7/00* (2017.01)

(52) U.S. Cl.
CPC ........ *G01R 33/5611* (2013.01); *G06T 7/0012* (2013.01); *G06T 2207/10088* (2013.01); *G06T 2207/20081* (2013.01)

(58) Field of Classification Search
USPC .......................................................... 324/309
See application file for complete search history.

(56) References Cited

U.S. PATENT DOCUMENTS

| | | | |
|---|---|---|---|
| 2015/0108978 A1 | 4/2015 | Wang et al. | |
| 2015/0355303 A1* | 12/2015 | Kuhara | G01R 33/5611 324/322 |
| 2016/0018498 A1 | 1/2016 | Boernert et al. | |
| 2016/0274209 A1* | 9/2016 | Dannels | G01R 33/4824 |
| 2016/0356870 A1* | 12/2016 | Sun | G01R 33/4833 |
| 2017/0309019 A1* | 10/2017 | Knoll | G06T 5/60 |
| 2017/0372193 A1* | 12/2017 | Mailhe | G06T 5/77 |
| 2018/0053085 A1* | 2/2018 | Matsumoto | G06N 3/045 |

OTHER PUBLICATIONS

International Search Report and Written Opinion from PCT/EP2021/062831 mailed Aug. 9, 2021.

\* cited by examiner

AUTOMATED ADJUSTMENT OF THE UNDERSAMPLING FACTOR

CROSS REFERENCE TO RELATED APPLICATIONS

This application is a U.S. national phase application of International Application No. PCT/EP2021/062831 filed on May 14, 2021, which claims the benefit of EP Application Serial No. 20174864.7 filed on May 15, 2020 and is incorporated herein by reference.

FIELD OF THE INVENTION

The invention relates to Magnetic Resonance Imaging, in particular to compressed sensing magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field or the main magnetic field. A magnetic resonance imaging system samples data in k-space and then reconstructs a magnetic resonance image from this k-space data.

Various quantities or properties of the subject can be measured spatially using MRI. A disadvantage of MRI is that it takes time to acquire the k-space data. It may be difficult for a subject to remain still during the acquisition of the k-space data. Compressed Sensing magnetic resonance imaging reduces the acquisition time by enabling the reconstruction of a magnetic resonance imaging image using undersampled k-space data. Currently an operator selects an undersampling factor (also knows and the acceleration factor) which affects how the k-space data is sampled. If too little k-space data is acquired the acquisition needs to be repeated with less undersampling.

United States patent application publication US 2018/0203081 discloses a system and method for estimating quantitative parameters of a subject using a magnetic resonance ("MR") system using a dictionary. The dictionary may include a plurality of signal templates that sparsely sample acquisition parameters used when acquiring data. The acquired data is compared with the dictionary using a neural network. Thus, systems and methods are provided that are more computationally efficient, and have reduced data storage requirements than traditional MRF reconstruction systems and methods. The US-patent application US2015/108978 concerns strategies for sparse sampling for magnetic resonance imaging. More in particular, this known strategy includes to select a base variable-density sampling pattern. This base variable-density sampling pattern is selected on the basis of criteria supplied by the user. Subsequently, the scan time of the base variable-density sampling pattern is determined by a simulating analysis or from a look-up table. To counter act an unacceptable scan time, the variable-density sampling pattern is modified to maximize the sampled k-space area without increasing the scan time.

SUMMARY OF THE INVENTION

The invention provides for a medical system, a computer program and a method in the independent claims. Embodiments are given in the dependent claims.

Embodiments may provide for an improved means of selecting the predicted undersampling factor. A neural network that is configured or trained to output the predicted undersampling factor in response to receiving magnetic resonance scan parameters. The magnetic resonance scan parameters are descriptive of a configuration of the magnetic resonance imaging system, which includes the configuration of the pulse sequence commands used to control the magnetic resonance imaging system. The predicted undersampling factor represents a prediction for the proper value of the undersampling prior to acquisiton of magnetic resonance signal, i.e. the undersampled is predicted or estimated prior to scanning of k-space. Thus, the predicted undersampling is made available already at the start of sampling of magnetic resonance signals by scanning of k-space according to a sampling pattern and sampling density function that is in coformity with the a priori predicted undersampling factor. The predicted undersampling factor is made available by a trained neural network in return to the input scan parameters prior to the start of MR data acquisition by sampling k-space. The neural network may be trained from historical data on successful image acquisitions that are associated with combinations of proper undersampling factors and (sets of) scan parameters.

In one aspect the invention provides for a medical system that comprises a memory storing machine-executable instructions. The memory further stores a neural network. The neural network is configured to output an predicted undersampling factor in response to receiving magnetic resonance scan parameters. A magnetic resonance scan parameter as used herein encompasses either a configuration of a magnetic resonance imaging system and/or a configuration of pulse sequence commands used for controlling that magnetic resonance imaging system.

Both the individual settings or adjustments possible in pulse sequence commands as well as the configuration of the magnetic resonance imaging system may have an effect on the predicted undersampling factor. The undersampling factor is an undersampling factor for when a compressed sensing magnetic resonance imaging protocol is performed. The magnetic resonance scan parameters are descriptive of a configuration of the magnetic resonance imaging system. This configuration of the magnetic resonance imaging system also encompasses the configuration of pulse sequence commands.

The medical system further comprises a computational system which is configured for controlling the magnetic resonance imaging system. Execution of the machine-executable instructions causes the computational system to receive pulse sequence commands configured to control a magnetic resonance imaging system to acquire k-space data according to a compressed sensing magnetic resonance imaging protocol. Execution of the machine-executable instructions further causes the computational system to receive the magnetic resonance scan parameters. The pulse sequence commands as well as the magnetic resonance scan parameters may be received in a variety of different ways. The magnetic resonance scan parameters and the pulse sequence commands with a particular configuration for the pulse sequence commands may in some instances be received from a user interface. In other cases the pulse sequence commands as well as the magnetic resonance scan parameters may be received by retrieving them from the memory.

Execution of the machine-executable instructions further causes the computational system to receive the predicted undersampling factor in response to inputting the magnetic resonance scan parameters into the neural network. Execution of the machine-executable instructions further causes the computational system to adjust the pulse sequence commands to modify sampling of the k-space data based on the undersampling factor. For example, when the magnetic resonance imaging system acquires the k-space data it is acquired in groups of k-space data as single lines or what may often be referred to as shots. The adjustment of the pulse sequence commands modifies how the k-space data is sampled so that it matches the predicted undersampling factor.

The undersampling factor is a factor which measures the pre-undersampling relative to the Nyquist theorem. This embodiment may be beneficial because it may provide for an improved means of setting the undersampling factor. If the undersampling factor is not reduced enough there is not a detrimental effect on the magnetic resonance image. However, it takes longer to acquire the k-space data than if the undersampling factor is set optimally. If the undersampling factor is too low then the resulting magnetic resonance image may be corrupted. The use of a neural network may enable setting of the undersampling factor using a greater variety of factors and also factors which may not be taken into account by a human operator. Typically a human operator will adjust the undersampling factor manually. The human may look at a variety of factors and then adjust the undersampling factor. This is usually built up on experience of the operator and is generally a haphazard process.

In another embodiment the magnetic resonance scan parameters comprise a radio-frequency coil configuration. This may include the number and arrangement of radio-frequency coils.

In another embodiment the magnetic resonance scan parameters comprise a scan mode specifying a two-dimensional or three-dimensional scan. This essentially identifies how the k-space data is acquired either three-dimensionally or for two-dimensional slices.

In another embodiment the magnetic resonance scan parameters comprise a sequence type specifying a contrast of the pulse sequence commands. Various parameters within pulse sequence commands can be used to change the contrast of the image.

In another embodiment the magnetic resonance scan parameters comprise an echo time. This is the fundamental value which may be set in the pulse sequence commands.

In another embodiment the magnetic resonance scan parameters comprise a pulse repetition time.

In another embodiment the magnetic resonance scan parameters comprise a voxel size or three-dimensional spatial resolution.

In another embodiment the magnetic resonance scan parameters comprise a three-dimensional field of view.

The voxel size or three-dimensional spatial resolution and the three-dimensional field of view as the field of view and the voxel size are somewhat redundant. Together they provide information about a field of view and matrix size or voxel size and matrix size. Many of the parameters, in configuring the magnetic resonance imaging system do have some overlapping redundancy.

In another embodiment the magnetic resonance scan parameters comprise a radio-frequency bandwidth during k-space sampling.

The above-mentioned magnetic resonance scan parameters may comprise a core of scan parameters that when used for training a neural network result in the production of an undersampling factor that is accurate.

In another embodiment the magnetic resonance scan parameters comprise a number of signal averages that are performed.

The magnetic resonance scan parameters which are described below are magnetic resonance scan parameters which may have an effect of additionally improving the estimate of the undersampling factor.

In another embodiment the magnetic resonance scan parameters further comprise a type of fat suppression protocol being used.

In another embodiment the magnetic resonance scan parameters further comprise a flip angle specified in the pulse sequence commands.

In another embodiment the magnetic resonance scan parameters further comprise a scan time.

In another embodiment the magnetic resonance scan parameters further comprise an orientation of the field of view.

In another embodiment the magnetic resonance scan parameters further comprise a fold over direction.

In another embodiment the magnetic resonance scan parameters further comprise a number of dynamic scans.

In another embodiment the magnetic resonance scan parameters further comprise a type of contrast agent used. The type of contrast agent used may of course be an important scan parameter when a contrast agent is used for a particular magnetic resonance imaging protocol. However, not all magnetic resonance imaging protocols use a contrast agent.

In another embodiment the magnetic resonance scan parameters further comprise a reconstruction voxel size or reconstruction matrix size.

In another embodiment the magnetic resonance scan parameters further comprise a type or selection of a pre-pulse used in the pulse sequence commands.

In another embodiment the magnetic resonance scan parameters further comprise an implementation of a partial Fourier half scan protocol or the selection of the implementation of a partial Fourier half scan protocol.

In another embodiment the magnetic resonance scan parameters further comprise an anatomical portion being examined. This may for example be a particular view and/or region of a body that is being examined.

In another embodiment the magnetic resonance scan parameters further comprise a shot type used. The shot is a group of k-space data points that are acquired as a single acquisition.

In another embodiment the magnetic resonance scan parameters further comprise a k-space profile order.

In another embodiment the magnetic resonance scan parameters further comprise a k-space trajectory.

In another embodiment magnetic resonance scan parameters further comprise a type of physiological synchronization. This could for example be synchronization with a heart phase or a breathing phase.

In another embodiment the magnetic resonance scan parameters further comprise a diffusion encoding technique type.

In another embodiment the magnetic resonance scan parameters further comprise a k-space segmentation factor.

In another embodiment the magnetic resonance scan parameters further comprise a number of echoes used to acquire the same k-space line.

In another embodiment execution of the machine-executable instructions further causes the computational system to retrieve archived scan parameter data from a magnetic resonance scan parameter database. These for example may include the various parameters used for the pulse sequence for various types of scans. This would also include the undersampling factor. The method further comprises the process of constructing archived training data from the archived scan parameter data. This may for example be extracting the value of the undersampling factor as well as the used magnetic resonance scan parameters. The training data may then comprise the magnetic resonance scan parameters as an input to the neural network and then the sampling factor that was actually used can be compared to the output of the neural network. Execution of the machine-executable instructions further causes the computational system to train the neural network using the archived training data. This may for example be done using a back-propagation algorithm.

In another embodiment the archived training data is received remotely.

In another embodiment the archived training data is received remotely via a network connection. This may for example enable the training of the neural network using data from a variety of locations and sites.

In another embodiment the medical system further comprises the magnetic resonance imaging system. Execution of the machine-executable instructions further causes the computational system to acquire the k-space data by controlling the magnetic resonance imaging system with the pulse sequence commands. Execution of the machine-executable instructions further causes the computational system to reconstruct magnetic resonance image data from the k-space data. The magnetic resonance image data is data which may be rendered either two- or three-dimensionally to form a magnetic resonance image.

In another embodiment the medical system further comprises a user interface. Execution of the machine-executable instructions further causes the computational system to display the undersampling factor and at least a portion of the magnetic resonance scan parameters on the user interface before adjusting the pulse sequence commands. Execution of the machine-executable instructions further causes the computational system to receive a predicted undersampling factor from the user interface in response to displaying the undersampling factor. The pulse sequence commands are adjusted using the predicted undersampling factor. In this embodiment the neural network still provides the undersampling factor but the operator has an opportunity to correct or change it using the user interface.

In another embodiment execution of the machine-executable instructions further causes the computational system to construct user-specific training data from the magnetic resonance scan parameters and the predicted undersampling factor. Execution of the machine-executable instructions further causes the computational system to train the neural network using the user-specific training data. The user-specific training data may for example include extracting the magnetic resonance scan parameters and the predicted undersampling factor and then making data which can be used for back propagation to train the neural network. This may for example be beneficial because it may be used for training the neural network for local preferences and/or for local pulse sequence commands or protocols that are used.

In another embodiment the neural network is a multi-layer neural network. In experiments it has been shown that the multi-layer neural network does an excellent job of predicting the undersampling factor when trained.

In another embodiment the multi-layer neural network comprises at least six layers. Each of the at least six layers is fully connected to adjacent layers. In examples described later the performance of the prediction of the undersampling factor was made with a multi-layer neural network that used seven layers. A six-layer multi-layer neural network will function properly. A seven-layer multi-layer neural network performs even better.

In another aspect the invention provides for a method of training a neural network. The method comprises retrieving archived scan parameter data from a magnetic resonance scan parameter database. The method further comprises constructing archived training data from the archived scan parameter data and then training the neural network using the archived training data. This training may be performed using a back-propagation algorithm. The neural network of the above described medical system may be pre-trained using this method.

In another aspect the invention provides for a method of operating a medical system. The method comprises receiving pulse sequence commands configured to control a magnetic resonance imaging system to acquire k-space data according to a compressed sensing magnetic resonance imaging protocol. The method further comprises receiving magnetic resonance scan parameters that are descriptive of a configuration of the pulse sequence commands and a configuration of the magnetic resonance imaging system.

The method further comprises receiving an predicted undersampling factor factor in response to inputting the magnetic resonance scan parameters into a neural network. The neural network is configured to output an predicted undersampling factor in response to receiving magnetic resonance scan parameters. The method further comprises adjusting the pulse sequence commands to modify the sampling pattern of the k-space data based on the predicted undersampling factor.

In another aspect the invention provides for a computer program that comprises machine-executable instructions for execution by a computational system that is configured for controlling a medical system. The computer program may also comprise the neural network. Execution of the machine-executable instructions causes the computational system to receive pulse sequence commands configured to control a magnetic resonance imaging system to acquire k-space data according to a compressed sensing magnetic resonance imaging protocol. Execution of the machine-executable instructions further causes the computational system to receive magnetic resonance scan parameters that are descriptive of a configuration of the pulse sequence commands and a configuration of the magnetic resonance imaging system.

Execution of the machine-executable instructions further causes the computational system to receive an predicted undersampling factor in response to inputting the magnetic resonance scan parameters into a neural network. The neural network is configured to output an predicted undersampling factor in response to receiving magnetic resonance scan parameters. Execution of the machine-executable instructions further causes the computational system to adjust the pulse sequence commands to modify the sampling or sampling pattern of the k-space data based on the predicted undersampling factor.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor or computational system of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the computational system of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the computational system. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a computational system. 'Computer storage' or 'storage' is a further example of a computer-readable storage medium. Computer storage is any non-volatile computer-readable storage medium. In some embodiments computer storage may also be computer memory or vice versa.

A 'computational system' as used herein encompasses an electronic component which is able to execute a program or machine executable instruction or computer executable code. References to the computational system comprising the example of "a computational system" should be interpreted as possibly containing more than one computational system or processing core. The computational system may for instance be a multi-core processor. A computational system may also refer to a collection of computational systems within a single computer system or distributed amongst multiple computer systems. The term computational system should also be interpreted to possibly refer to a collection or network of computing devices each comprising a processor or computational systems. The machine executable code or instructions may be executed by multiple computational systems or processors that may be within the same computing device or which may even be distributed across multiple computing devices.

Machine executable instructions or computer executable code may comprise instructions or a program which causes a processor or other computational system to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly. In other instances, the machine executable instructions or computer executable code may be in the form of programming for programmable logic gate arrays.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a computational system of a general purpose computer, special purpose computer, or other programmable data processing apparatus to produce a machine, such that the instructions, which execute via the computational system of the computer or other programmable data processing apparatus, create means for implementing the functions/acts specified in the flowchart and/or block diagram block or blocks.

These machine executable instructions or computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The machine executable instructions or computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the computational system of a computer system to interact with and/or control an external computing device and/or apparatus. A hardware interface may allow a computational system to send control signals or instructions to an external computing device and/or apparatus. A hardware interface may also enable a computational system to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

K-space data is defined herein as being the recorded measurements of radio frequency signals emitted by atomic spins using the antenna of a Magnetic resonance apparatus during a magnetic resonance imaging scan. Magnetic resonance data is an example of tomographic medical image data.

A Magnetic Resonance Imaging (MRI) image, MR image, or magnetic resonance imaging data is defined herein as being the reconstructed two- or three-dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
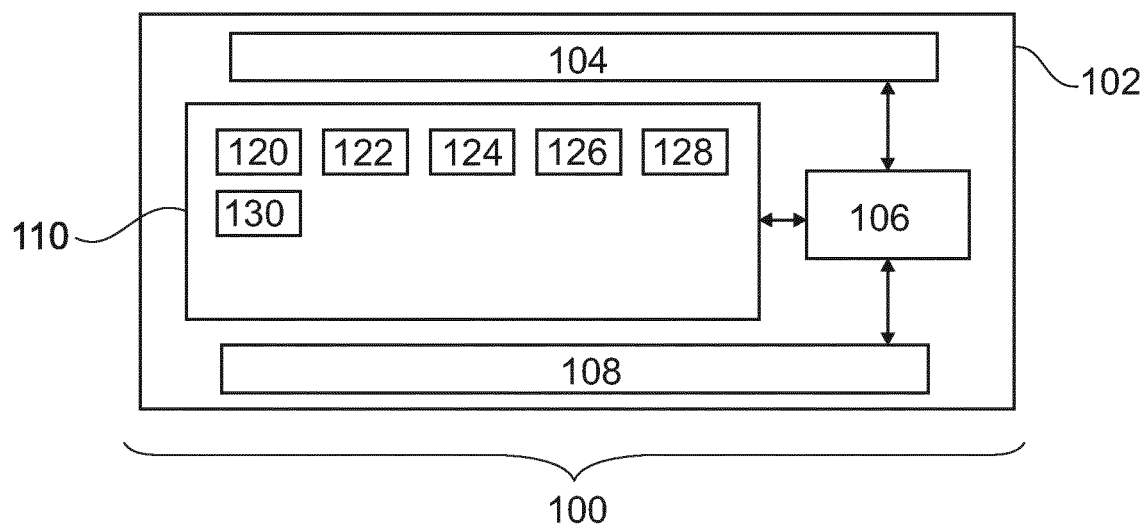
FIG. 1 illustrates an example of a medical system.

FIG. 1 illustrates an example of a medical system 100. In this example the medical system 100 comprises a computer 102. The medical system 100 further comprises a hardware interface 104 that is connected to a computational system 106. The computational system 106 is intended to represent one or more processors or other computational systems that may be located at one or more locations. The hardware interface 104, if present, may be used for controlling other components of the medical system 100. For example, if the medical system 100 includes a magnetic resonance imaging system. The computational system 106 is further shown as being connected to a user interface 108 and a memory 110. The memory 110 is intended to represent any type of memory that may be connected or accessible to the computational system 106.

The memory 110 is shown as containing machine-executable instructions 120. The machine-executable instructions 120 enable the computational system 106 to control other components of the medical system 100 via the hardware interface 104. The machine-executable instructions 120 may also enable the computational system 106 to perform various data processing and image processing tasks. The memory 110 is further shown as containing a neural network. The neural network has been trained so that it outputs an predicted undersampling factor for a compressed sensing magnetic resonance imaging protocol in response to receiving magnetic resonance scan parameters. The magnetic resonance scan parameters are descriptive of both a configuration of the magnetic resonance imaging system as well as a configuration of pulse sequence commands.

The memory 110 is further shown as containing pulse sequence commands 124. The memory 110 is further shown as containing magnetic resonance scan parameters 126. The memory 110 is further shown as containing an predicted undersampling factor factor 128 that has been received by the neural network 122 in response to inputting the magnetic resonance scan parameters 126. The undersampling factor 128 may for example be used for adjusting the k-space pattern or sampling pattern. The memory 110 is further shown as containing adjusted pulse sequence commands 130. These are the pulse sequence commands 124 after they have been adjusted such that they match the predicted undersampling factor 128.

Figure 2:
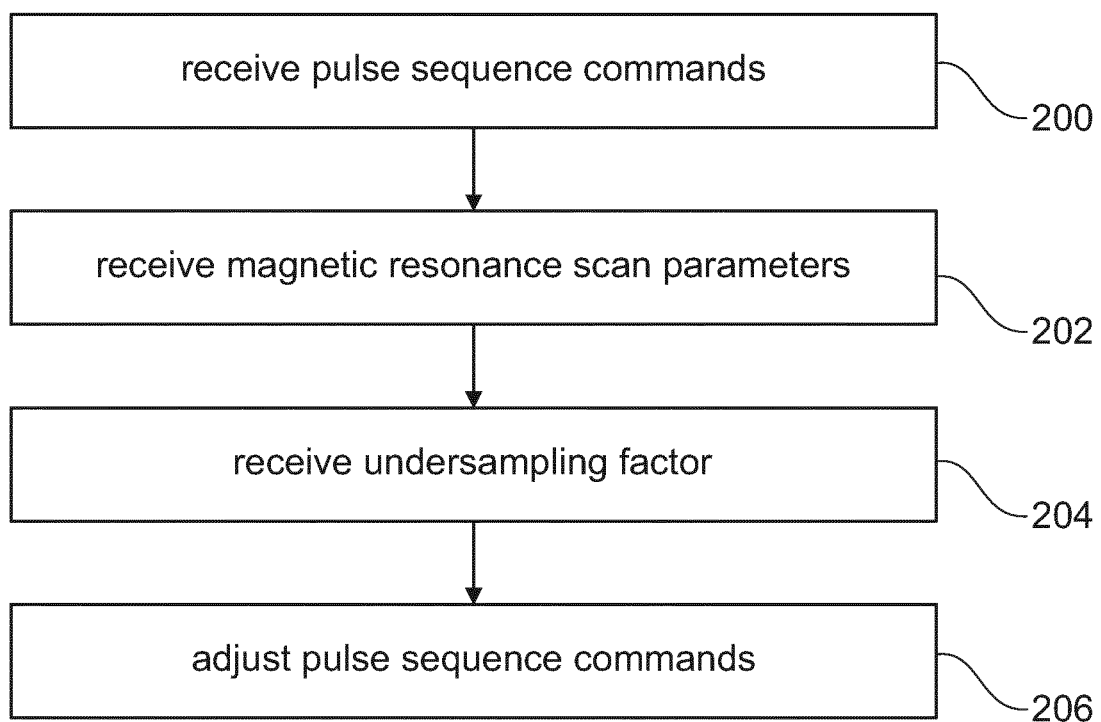
FIG. 2 shows a flow chart which illustrates an example of a method of operating the medical system of FIG. 1.

FIG. 2 shows a flowchart which illustrates a method of operating the medical system 100 of FIG. 1. First in step 200 the pulse sequence commands 124 are received. The pulse sequence commands 124 are configured to control a magnetic resonance imaging system to acquire k-space data according to a compressed sensing magnetic resonance imaging protocol. Next, in step 202, the magnetic resonance scan parameters are received. Then in step 204 the predicted undersampling factor 128 is received by inputting the magnetic resonance scan parameters 126 into the neural network 122. Finally, in step 206, the pulse sequence commands are adjusted using the predicted undersampling factor 128. This may include adjusting the sampling pattern in k-space.

Figure 3:
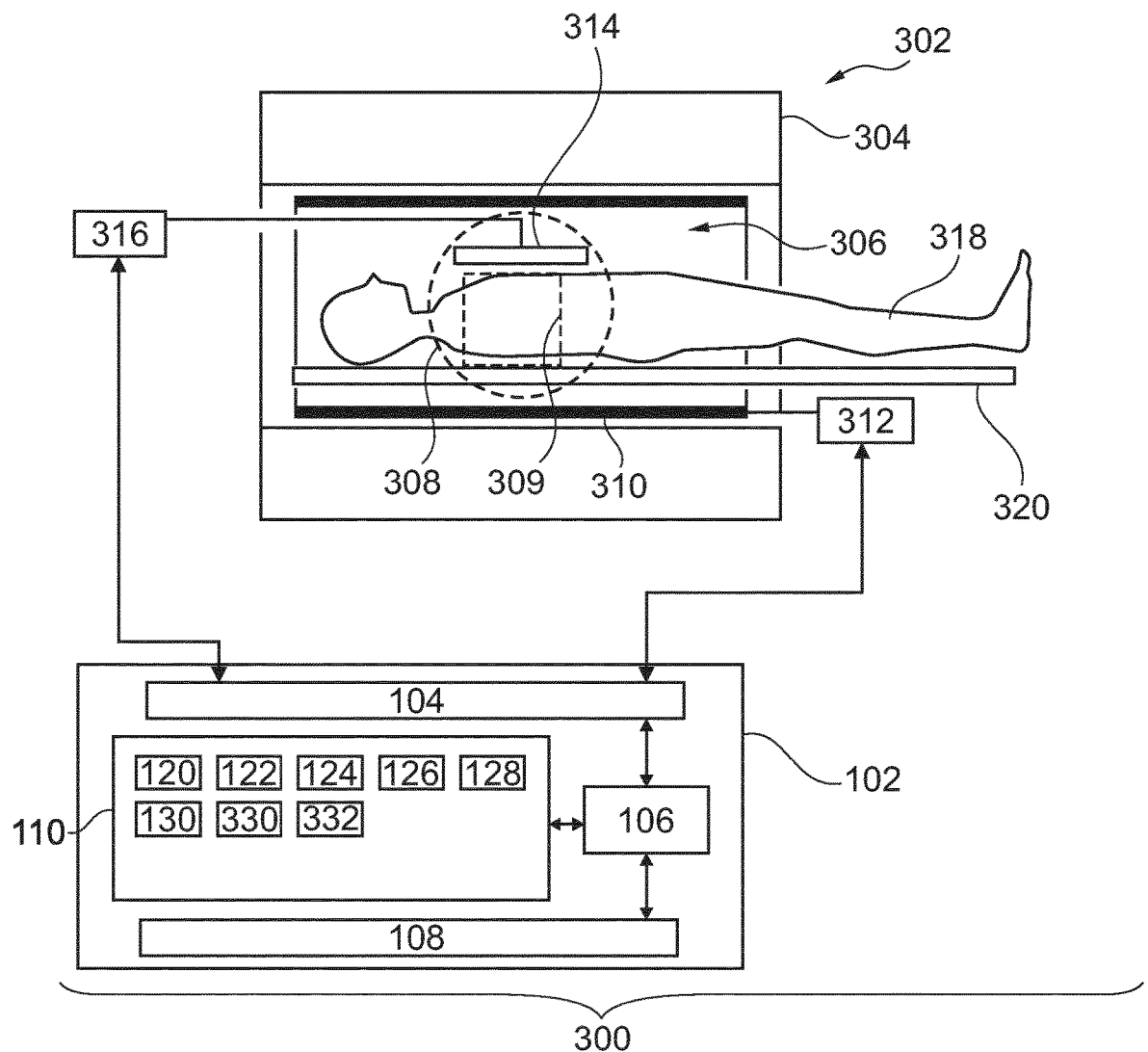
FIG. 3 illustrates a further example of a medical system.

FIG. 3 illustrates a further example of a medical system 300. The medical system 300 is similar to the medical system 100 of FIG. 1 except it additionally comprises a magnetic resonance imaging system 302.

The magnetic resonance imaging system 302 comprises a magnet 304. The magnet 304 is a superconducting cylindrical type magnet with a bore 306 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils.

Within the bore 306 of the cylindrical magnet 304 there is an imaging zone 308 where the magnetic field is strong and uniform enough to perform magnetic resonance imaging. A region of interest 309 is shown within the imaging zone 308. The magnetic resonance data that is acquired typically acquired for the region of interest. A subject 318 is shown as being supported by a subject support 320 such that at least a portion of the subject 318 is within the imaging zone 308 and the region of interest 309.

Within the bore 306 of the magnet there is also a set of magnetic field gradient coils 310 which is used for acquisition of preliminary magnetic resonance data to spatially encode magnetic spins within the imaging zone 308 of the magnet 304. The magnetic field gradient coils 310 connected to a magnetic field gradient coil power supply 312. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

Adjacent to the imaging zone 308 is a radio-frequency coil 314 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 314 is connected to a radio frequency transceiver 316. The radio-frequency coil 314 and radio frequency transceiver 316 may be replaced by separate transmit and receive coils and a separate transmitter and receiver. It is understood that the radio-frequency coil 314 and the radio frequency transceiver 316 are representative. The radio-frequency coil 314 is intended to also represent a dedicated transmit antenna and a dedicated receive antenna. Likewise the transceiver 316 may also represent a separate transmitter and receivers. The radio-frequency coil 314 may also have multiple receive/transmit elements and the radio frequency transceiver 316 may have multiple receive/transmit channels. For example if a parallel imaging technique such as SENSE or an acceleration technique such as compressed sensing is performed, the radio-frequency could 314 will have multiple coil elements.

The transceiver 316 and the gradient controller 312 are shown as being connected to the hardware interface 106 of a computer system 102.

The memory 110 is further shown as containing k-space data 330 that was acquired by controlling the magnetic resonance imaging system 302 with the adjusted pulse sequence commands 130. The memory 110 is further shown as containing magnetic resonance imaging data 332 that was reconstructed from the k-space data 330.

Figure 4:
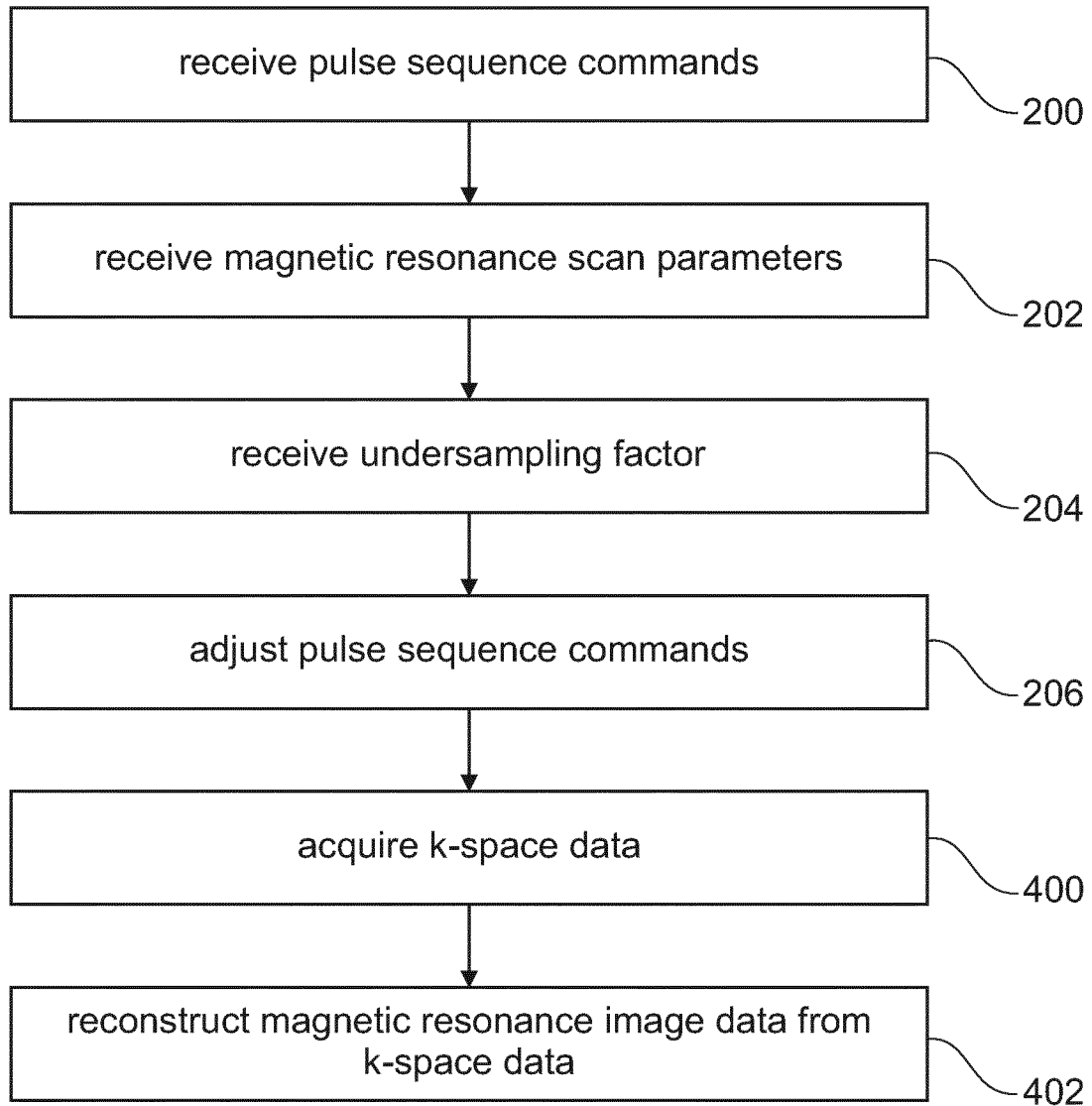
FIG. 4 shows a flow chart which illustrates an example of a method of operating the medical system of FIG. 3.

FIG. 4 shows a flowchart which illustrates a method of operating the medical system 300 of FIG. 3. The method in FIG. 4 is similar to the method illustrated in FIG. 2. The method in FIG. 4 begins with steps 200, 202, 204, and 206 as are illustrated in FIG. 2. After step 206 is performed the method proceeds to step 400. In step 400 the magnetic resonance imaging system 302 is controlled with the adjusted pulse sequence commands 130 to acquire the k-space data 330. Finally, in step 402, the magnetic resonance image data 332 is reconstructed from the k-space data 330.

MRI is a very versatile diagnostic method with a large number of imaging contrasts and functions. MR image acquisition is controlled by a large number of parameters, which are accessible in the clinical routine. Optimization of imaging parameters are done at every individual site. So far, the protocol optimization is not standardized and outcome and image quality depends on the experience of the operator.

Applications may use an artificial intelligence (AI) based method to automatically predict optimal compressed sensing acceleration factors (128) as the predicted undersampling factor for every protocol, reducing the variability of protocol variations from customer to customer and reducing the dependence of the outcome on the experience of the application specialist.

Examples may provide a very efficient way to exploit correlations in a large number of parameters and allow to directly connect parameters to outcome (such as image quality) by the use of training data.

For well-defined applications such as the use of compressed sensing for acceleration of image acquisition, neural network techniques such as deep learning can be used to predict optimal compressed sensing factors for any given parameter setting by the use of successful implementations of compressed sensing, done by experienced application specialists, as training data. The results of these predictions can then be used as starting point (educated guess) for every application specialist or can directly be provided as guidance for their own parameter optimizations during or after the application training.

Examples may address one or more of the following problems and disadvantages:
1. Outcome dependence of sequence parameter optimizations on application specialist experience:
   a. Better comparability between protocols at different sites
2. Increased work load on application specialist, especially during introduction of new products and sequences, leading to shortages of availability of application specialists:
   a. Reduce workload on application specialists through automatic guidance
3. Personal and continual overload on customers with protocol optimizations
   a. Provide automatic guidance for customers Examples may use a neural network, for example a neural network trained using a deep learning-based computer algorithm which is trained by well controlled MRI protocol parameters from protocol optimizations using compressed sensing. The computer algorithm is then used to predict optimal compressed sensing factors, depending on other parameter settings of the scan.

Examples may provide an algorithm based on a multilayer artificial neural network (neural network 122).

Training: In the initial training stage a set of well evaluated sequence parameter settings, in terms of image quality and maximum compressed sensing acceleration, can be collected. These sequence parameter settings (magnetic resonance scan parameters 126) can originate from well-trained application specialists or from sequence parameter settings currently in use. These collected sequence parameter settings are called initial training data hereafter. A schematic of the training stage of the artificial neural network is shown in FIG. 5 below.

During the initial training stage, a subset of sequence parameters from the initial training data is defined as input parameter and the compressed sensing acceleration factor is define as output parameter for the artificial neural network and used for the training of the network.

Figure 5:
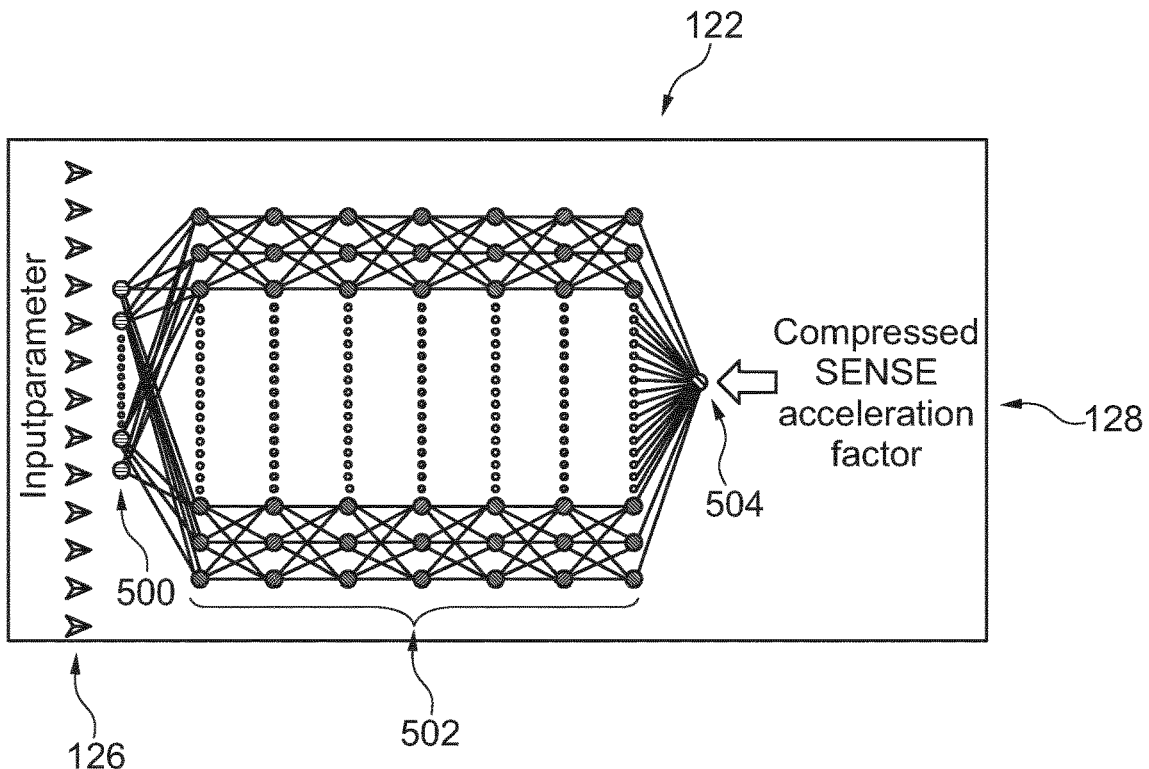
FIG. 5 illustrates the training of a neural network.

FIG. 5 shows a schematic drawing of the artificial neural network (neural network 122) in the initial training stage. In this stage selected sequence parameters or magnetic resonance scan parameters 126 and the corresponding compressed sensing acceleration factors from the predicted undersampling factor 128 from evaluated or prior datasets are fed into the neural network 122 to train the neural network. The arrows 126 represent the known magnetic resonance scan parameters 126. These are input into an input layer 500. The input layer is then connected to the fully connected layers 502. The final fully connected layer 502 is connected to an output 504 which gives the value of the predicted undersampling factor 128 or the compressed sensing acceleration factor.

Figure 6:
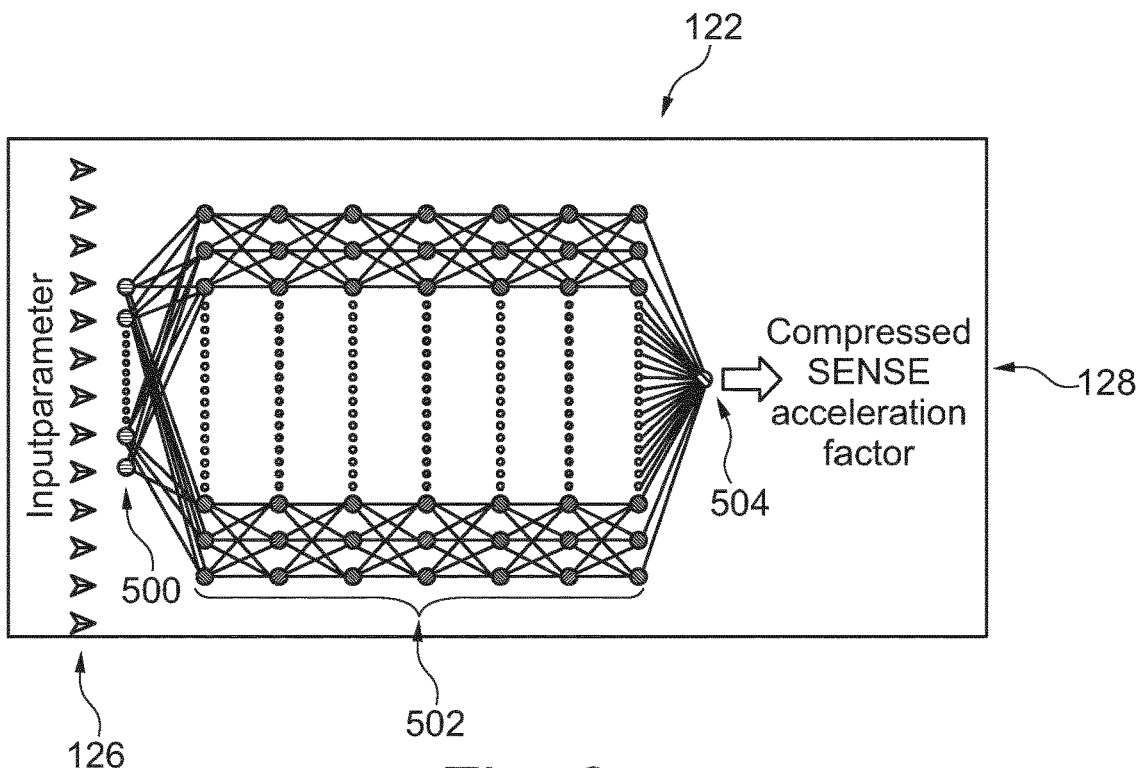
FIG. 6 illustrates the use of the neural network of FIG. 5.

In the evaluation stage the trained artificial neural network is then fed with sequence parameters as input parameters and the compressed sensing factor is calculated by the network as output parameter as is illustrated in FIG. 6 below. FIG. 6 illustrates the neural network 122 in the evaluation or use phase. In this state the neural network 122 has already been trained. In use the magnetic resonance scan parameters 126 are input into the input layer 500. The fully connected layers 502 then take the output and in response, at the output 504, the predicted undersampling factor 128 is provided. In this stage the trained artificial neuronal network is used to calculate the optimal Compressed SENSE acceleration factors from a number of input parameters.

Examples could directly integrate the neural network into the scan software, to allow an "automatic" setting for the selection of the compressed sensing acceleration factor (or "CS-SENSE"). This is outlined in FIG. 7. If "Automatic" is selected for "CS-SENSE" a number of parameters of the scan are directly fed into the trained neural network and the calculated compressed sense acceleration factor is then displayed in the software and used for the measurement. If further optimizations are done on the compressed sensing acceleration factor beyond what was calculated by the algorithm, these optimizations can be used as additional training data by the means of feedback or reinforced learning.

Figure 7:
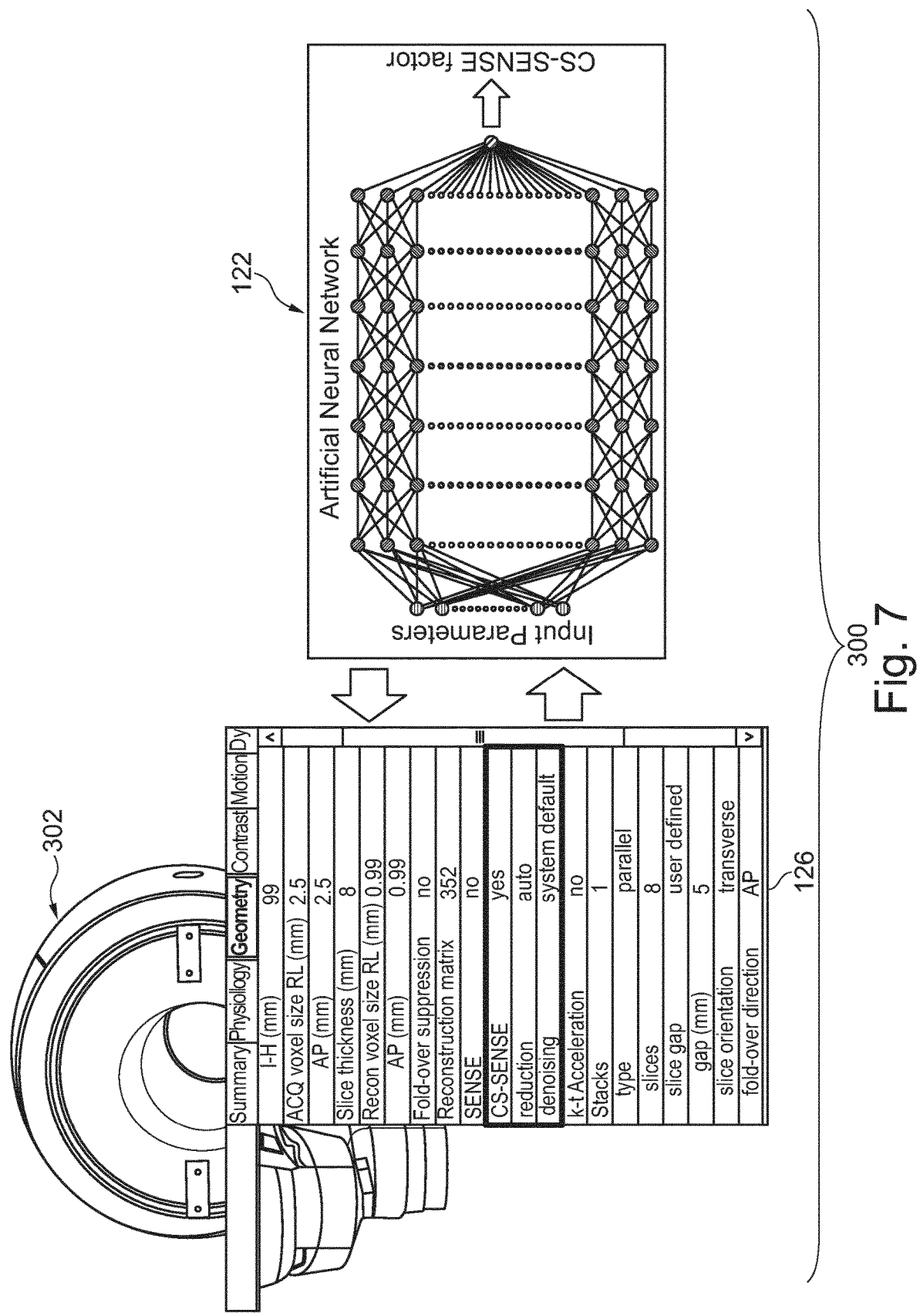
FIG. 7 illustrates the integration of the neural network into a magnetic resonance imaging system.

FIG. 7 shows how the neural network 122 can be integrated into a medical system 300. The user interface 108 of the magnetic resonance imaging system 302 has a page where the scan parameters can be entered. The user interface may provide the scan parameters 126 which are then input into the artificial neural network 122. In response the predicted undersampling factor 128 can be provided. It should be noted that the magnetic resonance scan parameters 126 in this example in the FIG. are not necessarily the parameters that are actually input into the neural network.

In FIG. 7, if CS-SENSE reduction is set to "auto", the optimal compressed sensing acceleration factor (CS-SENSE factor) is predicted by the pre-trained artificial neuronal network. The predicted CS-SENSE factor is displayed and used for the examination.

Proof of principle: A proof of principle implementation was tested with about 3000 datasets. Each of these datasets was MR sequence parameter setting using compressed sensing, which was optimized by an application specialist. For the initial training of the artificial neural network the data was split into 2934 training datasets (training data) and 227 test data sets (test data). The training data was used to train the artificial neuronal network. The test data was used to predict the optimal compressed sensing acceleration factor based on a set of input parameters. Subsequently the predicted optimal compressed sensing acceleration factors were compared to the compressed sensing acceleration factor optimized by the application specialist (cf. FIG. 8 below).

Figure 8:
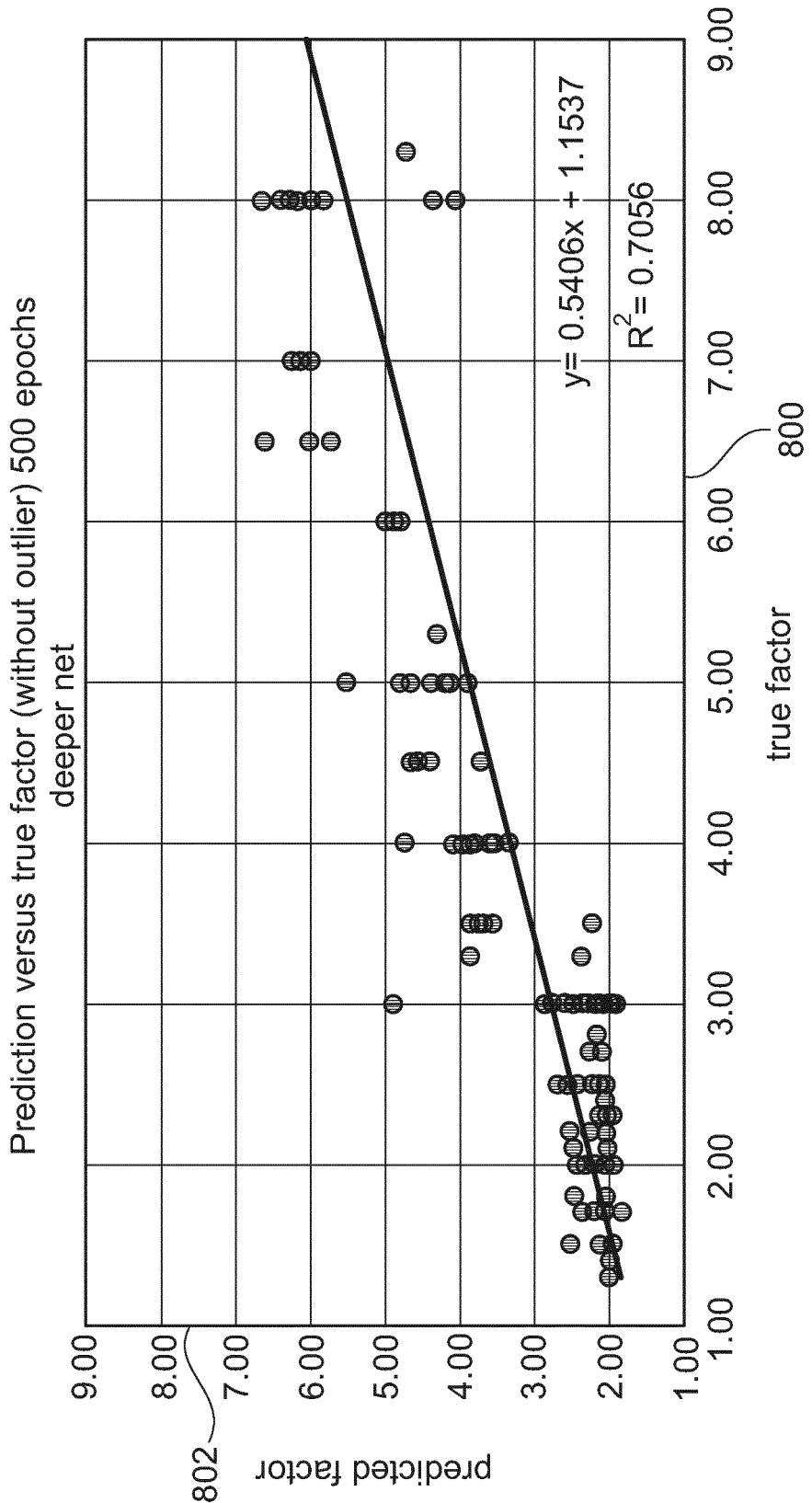
FIG. 8 shows a plot showing test results for the neural network.

FIG. 8 illustrates a test of the neural network 122. The plot in FIG. 8 shows the true factor 800 versus the predicted factor 802. About 3000 datasets of optimized MRI sequences (by application specialists) were split into 2934 training data sets for initial training of an artificial neural network. 227 datasets were used to test the trained artificial neuronal network by predicting optimal compressed sensing acceleration factors based on 17 predefined sequence parameters. The plot demonstrates the close agreement between the Application Specialist optimized compressed sensing acceleration factors and those predicted by the artificial neuronal network.

Field test: A field test was done together with application specialists. A database of archived scan parameter data was used, prior to implementing compressed sensing for this field test. A predicted set of compressed sensing acceleration factors computed using the trained artificial neural network. FIG. 5 shows the difference between the artificial neural network predicted and the application specialist estimated compressed sensing factors. In about 72% of the scans the difference between the predicted and actually used compressed sensing factors was below 1 and for 98% of the scans the difference was below 1.5, indicating the very promising performance of the herein proposed solution.

Figure 9:
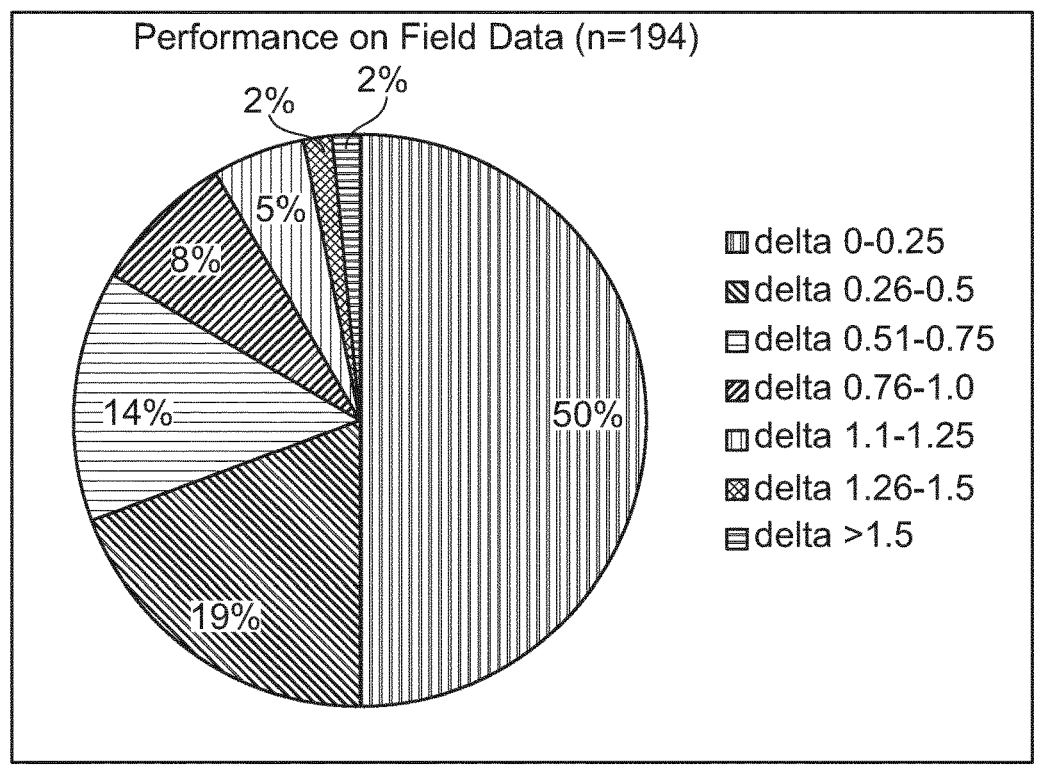
FIG. 9 shows a pie chart showing further test results for the neural network.
Figure 10:
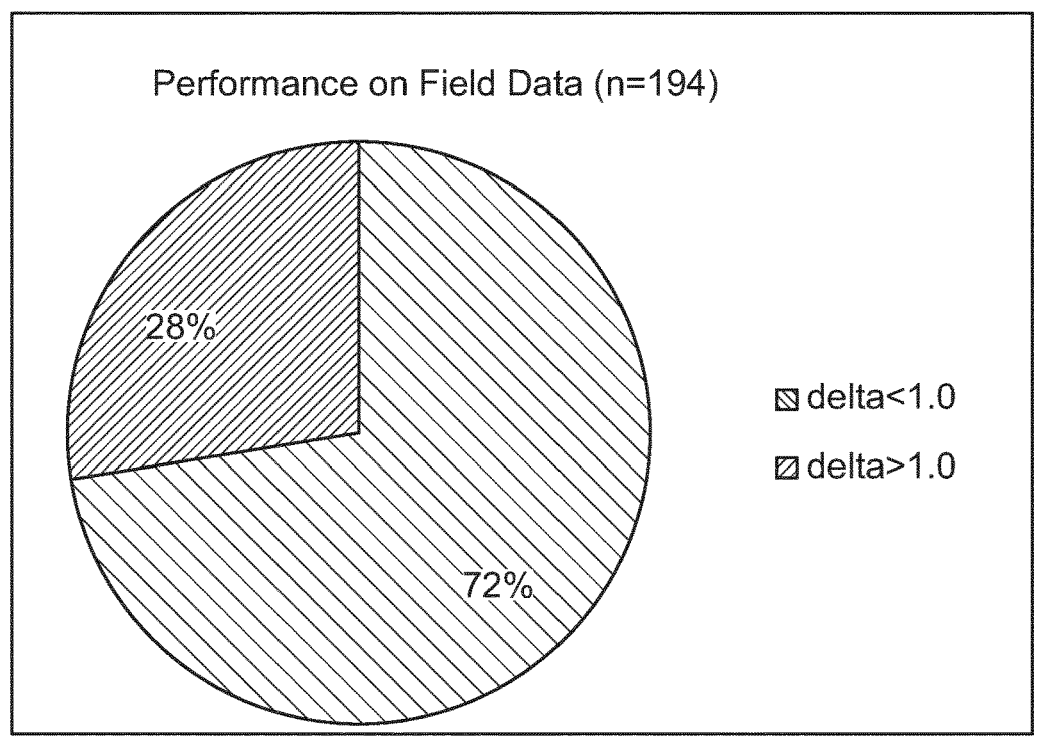
FIG. 10 shows a pie chart showing further test results for the neural network.

FIGS. 9 and 10 were constructed by comparing the output of the neural network to the actual used predicted undersampling factor 128 from clinical data, herein denoted as "delta". This is an accurate way of comparing the output of the neural network to predict undersampling factors 128 used in a clinical setting. The lower the delta value the more accurately the neural network corresponds to the predicted undersampling factor 128 that is actually used clinically.

FIG. 9 shows the delta value in the form of a pie chart for 194 comparisons. The pie chart is divided by the various delta levels.

FIG. 10 shows the same data in a format where 72% of the values is a delta of less than 1. Both FIGS. 9 and 10 illustrate that the neural network provides an predicted undersampling factor 128 that is very comparable to the predicted undersampling factor 128 that is in use clinically.

FIGS. 9 and 10: Performance of field test. In 98% of the scans the difference between the predicted and the actually used compressed sensing factors was below 1.5, in 72% of the scans the difference was below 1

MRI Parameters with Influence on Image Acceleration

The below listed magnetic resonance scan parameters may have an influence on the optimal image acceleration (undersampling factor 128). However, often times there may be strong correlations between different parameters. This means that from a single parameter or even a very limited set of parameters it cannot be judged what acceleration factor would be optimal. This makes the selection of the optimal acceleration factor a complex, multidimensional optimization problem. The parameters listed below are more or less general and independent of the MRI system manufacturer, however, naming conventions are very different between manufacturers. Additionally, the implementation of the parameters can be very different from manufacturer to manufacturer and not all parameters are accessible to the MRI user.

Some of the magnetic resonance scan parameters are discussed in greater detail below. The magnetic resonance parameters may comprise one or more of the following parameters:
1. Coils (Radio-Frequency coil configuration)
   The connected coils give various of information
   a. Number of Coil-elements has an influence on the performance of image acceleration
   b. Coil geometry has an influence on the performance of image acceleration
   c. The examined body part can be partly assumed: Knee Coil—very likely a knee; Head Coil—very likely head/brain examination
2. Scan.mode (3D vs. 2D)
   a. 3D allows higher acceleration factors, as the scan can be accelerated in two spatial dimensions
3. Sequence type (Spin Echo, Gradient Echo, balanced SSFP, Inversion Recovery, Turbo Spin Echo, FLASH, EPI)
   a. The scan technique includes information about the image contrast (T1, T2, T2*, T1/T2-bSSFP)
   b. Is a gradient balanced, gradient spoiled or RF spoiled sequence used
   c. → two parameters are used to describe this
   d. Fast imaging mode includes information about the image contrast and how k-space is acquired (1 k-space line per excitation versus several k-space lines per radiofrequency excitation
4. Echo Time (TE) and Repetition Time (TR)
   a. TE is the temporal distance between signal excitation and the acquisition of the k-space center
   b. TR is the time between two consecutive radiofrequency excitations of the same imaging volume
5. Flip angle
   a. Flip angle is the excitation power of the radiofrequency pulse used to excite the spins during the imaging sequence.
6. ACQ voxel size/spatial resolution in all three dimensions (including slice thickness)
   a. The acquired voxel size in all three spatial dimensions
   b. In tests herein, two parameters were used to describe this
7. Three-dimensional Field of View (FOV)
   a. The FOV is the coverage of the scan in all three spatial dimensions
   b. →two parameters were used by us to describe this
8. Matrix size
   a. The matrix size is the number of voxels or pixel along the three spatial dimensions
9. Scan time
   a. Time the scan needs w/o acceleration
10. Fat suppression (this may not be relevant for all MR protocols)
    a. Depending on the imaging sequence the suppression of the signal from fat might be necessary
    b. There are different techniques to suppress fat: mDixon, STIR, SPIR, SPAIR, PROSET, each will have a different impact on acceleration performance
    c. three parameters are used to describe this
11. Water Fat Shift (WFS): (this may not be relevant for all MR protocols)
    a. The shift of signals of water versus signals of fat in an acquired image in voxels
12. Band Width (BW)
    a. The bandwidth of the data sampling during the acquisition
13. Number of signal averages (NSA)
    a. The number of acquisitions of a single scan which are average to provide a decent image
14. No of dynamic scans
    a. The number of dynamics in a dynamic scan
    In addition to the above magnetic resonance scan parameters, it may be beneficial to include one or more of the following parameters:
1. Reconstruction voxel size/reconstruction matrix
   a. MR images are usually interpolated during image reconstruction
   b. Reconstruction voxel size provide the interpolated voxel size
   c. Reconstruction matrix provide the number of voxel in each of the 3 spatial dimensions
2. Prepulse type
   a. Use of different kinds of radiofrequency pre-pulses prior to radiofrequency signal excitation
   b. Different kinds of pre-pulses: T2 Prep, Inversion, Saturation, MDME, MTC, etc.
3. Partial Fourier (Halfscan)
   a. Partial Fourier or Halfscan is a technique where only a part of k-space is acquired and k-space symmetry is used to reconstruct a full image
4. Orientation of the imaging volume/Slice orientation
   a. In which direction is the image acquired: Axial, Coronal, or Saggital
5. Foldover direction
   a. In which direction is phase encoding (foldover) and in which direction is frequency encoding (no foldover)

6. Use of contrast agent
   a. Is contrast agent used for the scan? If yes there is much more signal available and acceleration can be higher
7. Shot mode (single vs. multi-shot)
   a. Is k-space acquired in one go or in multiple steps?
8. K-space profile order
   a. In which order are the k-space lines acquired: linear from one side to the other side, starting in the center of k-space, starting on the edges of k-space, asymmetric, random
9. K-Space trajectory
   a. How is k-space acquired: cartesian, spiral, radial, etc.
10. Physiologic synchronization
    a. Is the sequence synchronized to cardiac motion (e.g. via ECG)
    b. Is the sequence synchronized to respiratory motion (e.g. camera or resp. belt)
11. Diffusion encoding
    a. Is diffusion encoding used for techniques such as DTI or DWI?
12. K-space segmentation factor
    a. The Turbo Field Echo (TFE) and Turbo Spin Echo (TSE) factor describes how many k-space lines are acquired in one set of excitations (TFE) or during one echo train (TSE)
13. No of Echoes
    a. Describes how many echoes of the same k-space line are acquired While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical system
102 computer
104 hardware interface
106 computational system
108 user interface
110 memory
120 machine executable instructions
122 neural network
124 pulse sequence commands
126 magnetic resonance scan parameters
128 predicted undersampling factor
130 adjusted pulse sequence commands
200 receive pulse sequence commands configured to control a magnetic resonance imaging system to acquire k-space data according to a Compressed Sensing magnetic resonance imaging protocol
202 receive the magnetic resonance scan parameters
204 receive the predicted undersampling factor in response to inputting the magnetic resonance scan parameters into the neural network
206 adjust the pulse sequence commands to modify sampling the k-space data based on the predicted undersampling factor
300 medical system
302 magnetic resonance imaging system
304 magnet
306 bore of magnet
308 imaging zone
309 region of interest
310 magnetic field gradient coils
312 magnetic field gradient coil power supply
314 radio-frequency coil
316 transceiver
318 subject
320 subject support
330 k-space data
332 magnetic resonance imaging data
400 acquire the k-space data by controlling the magnetic resonance imaging system with the pulse sequence commands
402 reconstruct magnetic resonance image data from the k-space data
500 input layer
502 fully connected layers
504 output

The invention claimed is:

1. A system, comprising:
a memory, wherein the memory is configured to store machine executable instructions, wherein the memory further stores a neural network, wherein the neural network is configured to output a predicted undersampling factor for magnetic resonance imaging in response to receiving magnetic resonance scan parameters, wherein the magnetic resonance scan parameters are descriptive of a configuration of a magnetic resonance imaging system; and
a computational system, wherein the computational system is configured to control the magnetic resonance imaging system, wherein execution of the machine executable instructions causes the computational system to:
receive pulse sequence commands, wherein the pulse sequence commands are configured to control the magnetic resonance imaging system to acquire k-space data according to a Compressed Sensing magnetic resonance imaging protocol;
receive the magnetic resonance scan parameters;
receive the predicted undersampling factor in response to inputting the magnetic resonance scan parameters into the neural network and prior to the acquisition of k-space data;
adjust the pulse sequence commands to select or modify sampling of the k-space data based on the predicted undersampling factor; and
store the adjusted pulse sequence commands in the memory.

2. A method of operating a system which includes a computational system, the method comprising:
   the computational system receiving pulse sequence commands, wherein the pulse sequence commands are configured to control a magnetic resonance imaging system to acquire k-space data according to a Compressed Sensing magnetic resonance imaging protocol;
   the computational system receiving magnetic resonance scan parameters, wherein the magnetic resonance scan parameters are descriptive of a configuration of the pulse sequence commands and a configuration of the magnetic resonance imaging system;
   the computational system receiving a predicted undersampling factor in response to inputting the magnetic resonance scan parameters into a neural network; and
   the computational system adjusting the pulse sequence commands to select or modify sampling of the k-space data based on the predicted undersampling factor; and
   the computational system storing the adjusted pulse sequence commands in a memory,
   wherein the neural network is configured to output the undersampling factor in response to receiving the magnetic resonance scan parameters and prior to the acquisition of the k-space data.

3. A non-transitory computer-readable medium having stored thereon a computer program comprising machine executable instructions for execution by a computational system configured to control a system, wherein execution of the machine executable instructions causes the computational system to:
   receive pulse sequence commands, wherein the pulse sequence commands are configured to control a magnetic resonance imaging system to acquire k-space data according to a Compressed Sensing magnetic resonance imaging protocol;
   receive magnetic resonance scan parameters, wherein the magnetic resonance scan parameters are descriptive of a configuration of the pulse sequence commands and a configuration of the magnetic resonance imaging system;
   receive an undersampling factor in response to inputting the magnetic resonance scan parameters into a neural network; and
   adjust the pulse sequence commands to select or modify sampling of the k-space data based on the undersampling factor; and
   store the adjusted pulse sequence commands in a memory,
   wherein the neural network is configured to output a predicted undersampling factor in response to receiving the magnetic resonance scan parameters and prior to the acquisition of k-space data.

4. The system of claim 1, wherein the magnetic resonance scan parameters comprise at least one of: a radio-frequency coil configuration, a scan mode specifying a two-dimensional or three-dimensional scan, a sequence type specifying a contrast of the pulse sequence commands, an echo time, a pulse repetition time, a voxel size or three-dimensional spatial resolution, a three dimensional field of view, or a radio frequency bandwidth during k-space sampling.

5. The system of claim 1, wherein execution of the machine executable instructions further causes the computational system to:
   retrieve archived scan parameter data from a magnetic resonance scan parameter database;
   construct archived training data from the archived scan parameter data; and
   train the neural network using the archived training data.

6. The system of claim 1, wherein execution of the machine executable instructions further causes the computational system to:
   retrieve archived training data remotely; and
   train the neural network using the archived training data.

7. The system of claim 1, wherein the system further comprises the magnetic resonance imaging system, wherein execution of the machine executable instructions further causes the computational system to:
   acquire the k-space data by controlling the magnetic resonance imaging system with the adjusted pulse sequence commands;
   reconstruct magnetic resonance image data from the k-space data; and
   store the reconstructed magnetic resonance image data in the memory.

8. The system of claim 1, comprising a user interface, wherein execution of the machine executable instructions further causes the computation system to:
   display the predicted undersampling factor and at least a portion of the magnetic resonance scan parameters on the user interface before adjusting the pulse sequence commands; and
   receive an undersampling factor from the user interface in response to displaying the predicted undersampling factor, wherein the pulse sequence commands are adjusted using the undersampling factor received from the user interface.

9. The system of claim 1, wherein the magnetic resonance imaging protocol is a parallel imaging magnetic resonance imaging protocol.

10. The system of claim 1, wherein the neural network is a muti-layer neural network.

11. The method of claim 2, further comprising:
   acquiring the k-space data by controlling the magnetic resonance imaging system with the adjusted pulse sequence commands;
   reconstructing magnetic resonance image data from the k-space data; and
   storing the reconstructed magnetic resonance image data in the memory.

12. The method of claim 2, further comprising:
   displaying the predicted undersampling factor and at least a portion of the magnetic resonance scan parameters on a user interface before adjusting the pulse sequence commands; and
   receiving an undersampling factor from the user interface in response to displaying the predicted undersampling factor, wherein the pulse sequence commands are adjusted using the undersampling factor received from the user interface.

13. The method of claim 2, further comprising:
   retrieving archived scan parameter data from a magnetic resonance scan parameter database;
   constructing archived training data from the archived scan parameter data; and
   training the neural network using the archived training data.

14. The method of claim 2, further comprising:
   retrieving archived training data is retrieved remotely; and
   training the neural network using the archived training data.

15. The method of claim 2, wherein the magnetic resonance scan parameters comprise at least one of: a radio-frequency coil configuration, a scan mode specifying a two-dimensional or three-dimensional scan, a sequence type specifying a contrast of the pulse sequence commands, an echo time, a pulse repetition time, a voxel size or three-dimensional spatial resolution, a three dimensional field of view, or a radio frequency bandwidth during k-space sampling.

16. The system of claim 4, wherein the magnetic resonance scan parameters further comprise at least one of: a type of fat suppression protocol being used, a flip angle, a scan time, an orientation of the field of view, a foldover direction, a number of dynamic scans, a type of contrast agent used, or a number of signal averages.

17. The system of claim 6, wherein the archived training data is retrieved remotely through a network connection.

18. The system of claim 8, wherein execution of the machine executable instructions further causes the computational system to:
- construct user specific training data from the magnetic resonance scan parameters and the predicted undersampling factor; and
- train the neural network using the user specific training data.

19. The system of claim 10, wherein the multi-layer neural network comprises at least 6 layers, and wherein each of the at least 6 layers is fully connected to adjacent layers.

20. The system of claim 16, wherein the magnetic resonance scan parameters further comprise at least one of: a reconstruction voxel size or reconstruction matrix size, a type of pre-pulse used, an implementation of partial Fourier half scan protocol, an anatomical portion being examined, a shot typed used, a k-space profile order, a k-space trajectory, a physiological synchronization, a diffusion encoding technique type, a k-space segmentation factor, or a number of echoes used to acquire the same k-space line.

\* \* \* \* \*